United States Patent [19]

Hammarlund et al.

[11] 4,013,952
[45] Mar. 22, 1977

[54] MEANS FOR CURRENT MEASURING IN STATIC CONVERTORS

[75] Inventors: Bertil Hammarlund; Göte Liss, both of Ludvika, Sweden

[73] Assignee: Asea Aktiebolag, Vasteras, Sweden

[22] Filed: Feb. 27, 1975

[21] Appl. No.: 553,730

[30] Foreign Application Priority Data

Mar. 22, 1974 Sweden .............................. 7403873

[52] U.S. Cl. ..................... 324/119; 324/123 R; 328/137
[51] Int. Cl.² ..................... G01R 19/22; H04B 1/68
[58] Field of Search ........... 324/123 R, 119, 103 P, 324/102, 114; 328/137; 307/235 F

[56] References Cited
UNITED STATES PATENTS

| 2,505,074 | 4/1950 | Trevor | 328/137 |
| 2,666,848 | 1/1954 | Goodwin | 328/137 |
| 2,697,814 | 12/1954 | Grant et al. | 324/119 |

Primary Examiner—R. V. Rolinec
Assistant Examiner—Ernest F. Karlsen
Attorney, Agent, or Firm—Watson, Cole, Grindle & Watson

[57] ABSTRACT

For measuring the load current in a static convertor, there are provided a direct current measuring device on the direct current side of the convertor and an alternating current measuring device on the alternating current side. These measuring devices are connected by a dominance coupling arrangement to the output side of the measuring device. There the signal is fed to a control pulse transducer, which controls the convertor in accordance with the greatest of the signals fed by the measuring device.

3 Claims, 3 Drawing Figures

MEANS FOR CURRENT MEASURING IN STATIC CONVERTORS

BACKGROUND OF THE INVENTION

1. Field of the Invention

The present invention relates to a means for measuring the load current in a static convertor.

2. The Prior Art

Measuring of the load current in a static converter, for example for a high-voltage DC transmission, is usually carried out by measuring the direct current with the help of a transductor or possibly a Hall generator. Both these components are in themselves rather stable and reliable, but require feeding by auxiliary power to operate them. This involves a risk of a fault because the auxiliary power can drop out and it has proved difficult to secure a reliable reserve for this power. Disappearance of the auxiliary power causes a drop-out of the current signal to the control equipment of the convertor, which in turn usually leads to a surge in the static convertor.

SUMMARY OF THE INVENTION

To secure the current signal even if the auxiliary power to the DC measuring device should be cut out, it is proposed according to the invention to complete the DC measuring with a current measuring on the AC side of the convertor. The signal indicating the greatest current will then be the most correct one, so the different current measurings must be connected together by way of a dominance coupling.

Regarding the reliability of the current measurements on the DC and AC sides, it can be mentioned that the measuring on the AC side is performed by means of current transformers which are independent of auxiliary power and which are rather rugged and insensitive to external disturbances. On the other hand, disturbances in the convertor, such as valve faults as well as by-passing of a convertor, may cause the alternating current to become much smaller than the direct current and, since it is the direct current that normally indicates the load of the convertor or at least the load on its valves, it is in principle the direct current measuring that is essential. Therefore, as long as the direct current measuring operates properly, this is to be preferred, so the desired security is only obtained when measuring on both sides of the convertor and when selecting the greatest value.

BRIEF DESCRIPTION OF THE DRAWINGS

In other respects the invention will be described in more detail with reference to the accompanying drawing, where FIG. 1 shows a convertor with a current measuring device according to the invention whereas

DESCRIPTION OF THE PREFERRED EMBODIMENTS

Figure 1:
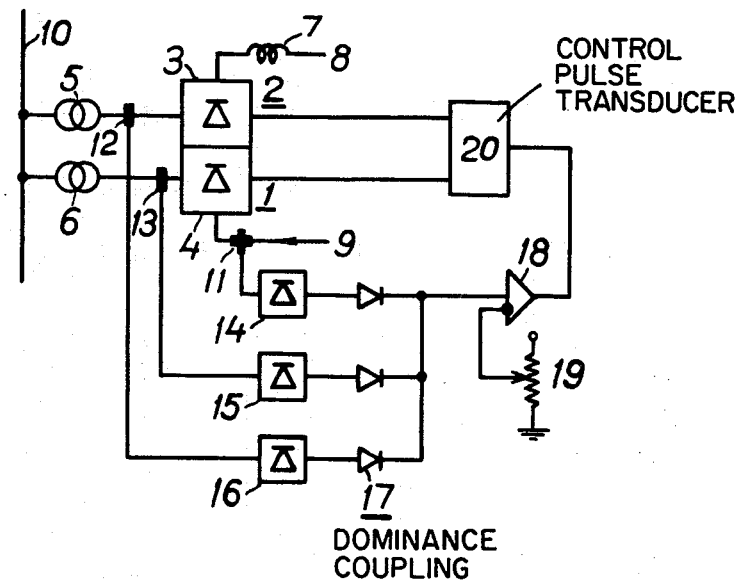

FIG. 1 shows two convertors 1 and 2, each comprising a rectifier bridge 3 and 4, respectively, and a convertor transformer 5 and 6, respectively. On their DC sides the convertors are connected in series and to a smoothing reactor 7 and connected to DC lines 8 and 9. The AC sides are connected in parallel and connected to an AC network 10.

According to the invention, current measuring means 11, 12 and 13 are connected on both the DC and AC sides. Since the convertors are series-connected on the DC side, only one DC measuring device is required, for example a transductor 11. On their AC sides, where the convertors are parallel-connected, however, they should be provided each with a current transformer 12 and 13, respectively. The signals from the current measuring devices 11 to 13 are rectified in rectifying bridges 14, 15 and 16, respectively, and are connected to a dominance coupling, here indicated as a diode coupling 17. In this way the greatest signal is selected and this is connected to the input of a current regulator 18 to which there is also connected a reference value for the current which can be obtained (as indicated symbolically) from a potentiometer 19. The regulator 18 controls a control pulse transducer 20 for control of the rectifier bridges 3 and 4. The control pulse transducer may be designed, for example, according to U.S. Pat. No. 3,551,778.

In this way it is ensured that the convertor is constantly controlled according to the greatest current signal which is normally the one which corresponds best to the current load in the convertors, since a fault of one sort or the other in a current measuring device almost always causes its signal to disappear or be reduced considerably. Only in the event of a fault on all three current measuring devices will the signal 18 be faulty.

Figure 2:
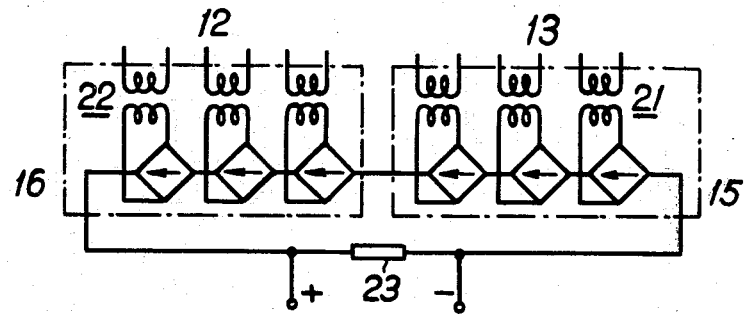
FIGS. 2 and 3 show variants of the dominance coupling.

The diodes 17 can be omitted if the rectifier bridges 14 to 16 are series-connected on the DC side since such a series-connection will form a dominance coupling. One example of this is shown in FIG. 2 where the outputs from the three-phase current transformers 12 and 13 are connected to the rectifier bridges 15 and 16 by way of intermediate transformers 21, 22. The rectifier bridges are series-connected by way of a resistor 23 and the voltage across this resistor constantly corresponds to the greatest current signal from 12 and 13. The rectifier bridge 14 could also be connected in series with 15 and 16.

Figure 3:
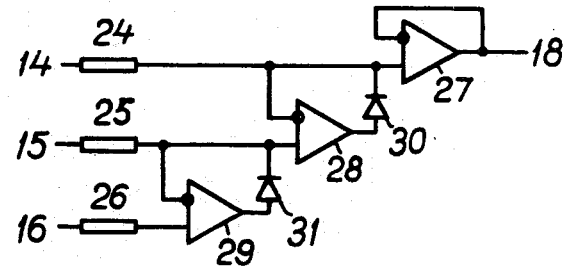

Another form of a dominance coupling is shown in FIG. 3, where the voltage outputs from 14 to 16 have been connected, by way of resistors 24 to 26, to feedback operational amplifiers 27, 28 and 29, respectively. In the feed-back couplings for 28 and 29 there are connected diodes 30 and 31, respectively.

As long as the voltage from 14 is not lower than the voltage from 15, the diode 30 will be blocked and the output signal from the amplifier 27 will be equal to the voltage from 14. If, on the other hand, the voltage from 14 is less than the voltage from 15, the output signal from 28 will open the diode 30 and dominate the voltage on the input side of 27. This will lead to the same feed-back of the amplifier 28 as of 27 and the voltage from 15 will pass through 28 and 27 into the regulator 18.

Thus it can be seen that the amplifier 28 with the feed-back diode 30 selects the greatest of the voltages from 14 and 15, and, similarly, the amplifier 29 selects the greatest of the voltages from 15 and 16, which voltage in the amplifier 28 is compared with the voltage from 14.

The connection according to FIG. 3 entails the advantage in relation to the connection of FIG. 1 that the combination amplifier - diode will operate as an ideal diode, that is as a diode without voltage drop.

We claim:

1. Means for measuring the load current in a static convertor (1,2) having an alternating current side and a direct current side, said measuring means having an output (18), which measuring means comprises a direct-current measurement device (11) on the direct-current (8,9) of the convertor and an alternating-current measurement device (12,13) of the alternating-current side (10) of the convertor, and a dominance coupling means (17 or 27–31) connecting said measurement devices for comparing the signals therefrom and selecting the greatest of said signals and for supplying such greatest signal to the output.

2. Means according to claim 1, in which the dominance coupling means comprises series-connected rectifiers on the output side of at least some of the measuring devices.

3. Means according to claim 1, in which the dominance coupling means comprises operational amplifier means in series with each of the measuring devices.

* * * * *